United States Patent
Jackson, Jr. et al.

[11] Patent Number: 5,288,380
[45] Date of Patent: Feb. 22, 1994

[54] METHOD FOR FABRICATION OF THIN-FILM BOLOMETRIC MATERIAL

[75] Inventors: David A. Jackson, Jr., Springfield; Samuel M. Tomarchio, Woodbridge, both of Va.

[73] Assignee: The United States of America as represented by the Secretary of the Army, Washington, D.C.

[21] Appl. No.: 917,257

[22] Filed: Jul. 23, 1992

[51] Int. Cl.[5] ............................................. C23C 14/34
[52] U.S. Cl. ...................... 204/192.21; 204/192.15; 204/192.26
[58] Field of Search .................. 204/192.15, 192.21, 204/192.26

[56] References Cited

U.S. PATENT DOCUMENTS 3,899,407 8/1975 Eastwood et al. ............ 204/192.15

OTHER PUBLICATIONS

Sargent-Welch Periodic Table of the Elements, 1968.

Primary Examiner—Aaron Weisstuch
Attorney, Agent, or Firm—Milton W. Lee; Alain L. Bashore; Anthony T. Lane

[57] ABSTRACT

A technique for fabrication of thin-film bolometric materials for use in low-ohm resistance multi-detector devices. A group IB periodic table element is reactively co-sputtered with small amounts of a dopant in a reduced gas atmosphere. The reactive co-sputtering is achieved in an oxygen containing atmosphere, where the dopant has an oxide that is highly temperature dependent with an electrical resistance that varies in accordance with the oxide content of the dopant. A reduced electrical resistance of the resultant doped material is achieved.

3 Claims, 1 Drawing Sheet

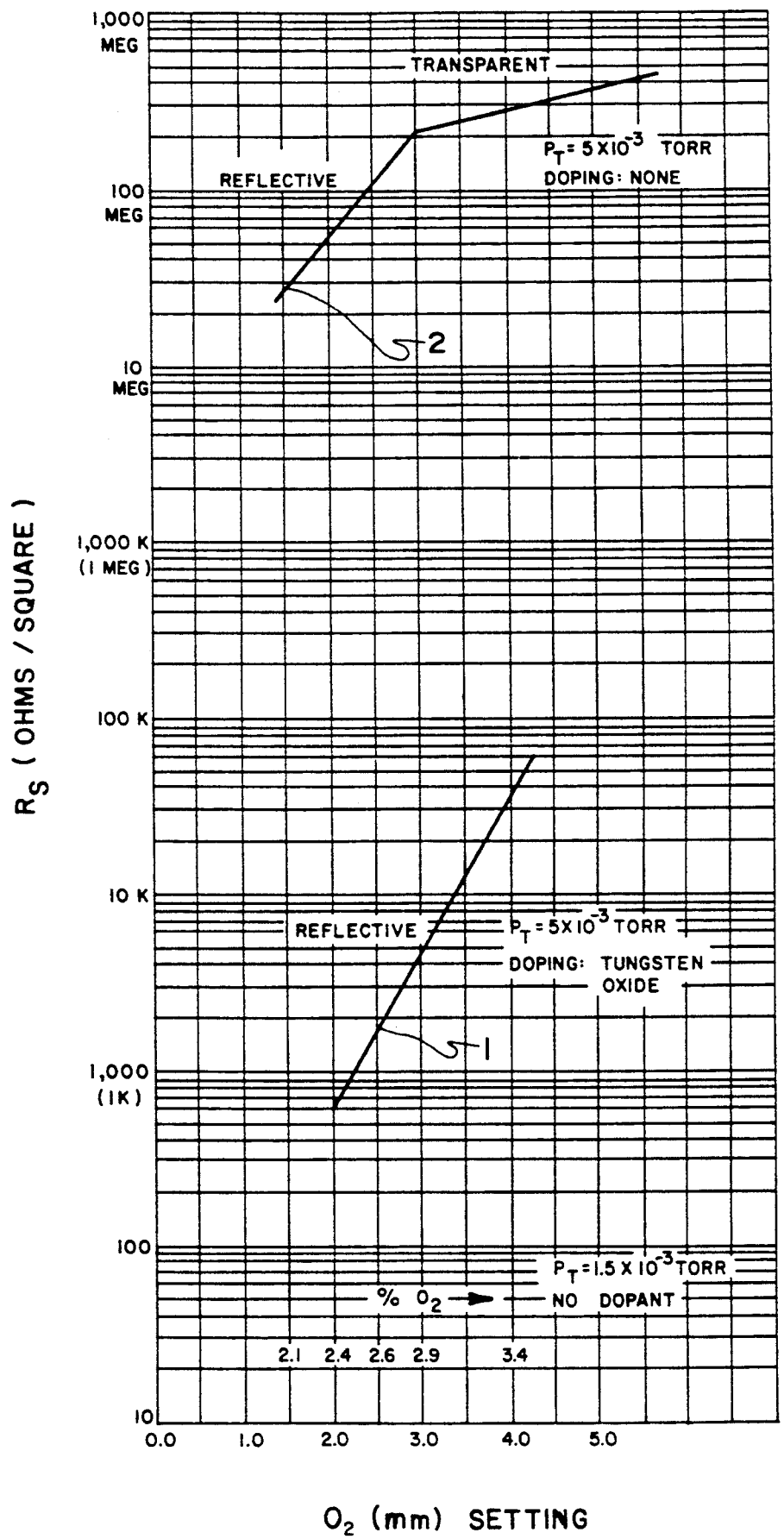

METHOD FOR FABRICATION OF THIN-FILM BOLOMETRIC MATERIAL

BACKGROUND OF THE INVENTION

1. Field of the Invention

The present invention generally relates to materials fabrication and more specifically, to thin-film materials having low-electrical resistance for use in bolometers.

2. Description of Prior Art

A bolometric material is a material that utilizes an electrical property (such as electrical resistance) which changes with temperature, usually used by a multi-detector device for detecting and measuring small amounts of thermal radiation. To be utilized in a multi-detector device such materials must comply with both thermal and electronic requirements.

It is important that these materials be fabricated in thin-film form to lower noise and have large thermal coefficients of resistance (TCR). An electrical requirement especially for use in low-ohm resistance multi-detector devices is that the material must also have a low electrical resistance.

Bolometric materials are manufactured from many different materials by various processes. Materials used in the prior art include: semiconductors, such as carbon; mixed oxides of nickel, cobalt, and manganese; germanium doped with gallium or indium; and indium antimonide. Different forms of these materials for bolometers are known, including a class of bolometers incorporating a capacitive element using thin films with temperature dependent electrical polarization properties. For thin film manufacture of materials such as the oxides mentioned above reactive sputtering is usually utilized. Unfortunately, there is a problem in that the prior art materials which have high TCR's also have high-electrical resistivities. Another problem is that many of the thin films, such as the above mentioned oxide films, produced by reactive sputtering are difficult to reproduce because of the disastrous effects of minute changes in deposition pressure on resultant electrical conductivity.

While the prior art has reported using bolometric materials none have established a basis for a specific method that is dedicated to the task of resolving the particular problem at hand.

What is needed in this instance is a method to reduce the electrical resistance of a material while retaining thermal characteristics for bolometer use.

SUMMARY OF THE INVENTION

It is the main object of the invention to provide a method to reduce the electrical resistivity of a material while retaining required thermal characteristics for bolometer use.

According to the invention, a technique is disclosed for reducing the electrical resistivity of materials while retaining thermal characteristics for bolometer use. In the preferred embodiment small amounts of tungsten are reactively co-sputtered with vanadium to form a doped thin film of vanadium oxide with resistance values in the low kilo ohms per square range. The reactive co-sputtering is achieved in an oxygen containing atmosphere, where the dopant has an oxide that is highly temperature dependent with an electrical resistance that varies in accordance with the oxide content of the dopant. A reduced electrical resistance of the resultant doped material is achieved. Other materials for films and dopants are disclosed which may be utilized by the present technique.

BRIEF DESCRIPTION OF THE DRAWING

The foregoing and other objects, aspects and advantages will be better understood from the following detailed description of a preferred embodiment of the invention with reference to the drawings, in which:

The sole drawing figure is a graphical plot of electrical resistance versus deposition atmospheric oxygen content.

DETAILED DESCRIPTION OF A PREFERRED EMBODIMENT OF THE INVENTION

Referring now to the drawing figure, there is shown the experimental results of the technique of fabrication for the present invention as compared to a conventional process. The metal vanadium is used in the conventional process as a metal target in a reactive sputtering process in an atmosphere of argon and oxygen to form an oxide. The inclusion of oxygen is to react with the sputtered metal so as to deposit the metal as an oxide. An R. F. Magnetron Sputtering System is used at low concentrations of oxygen in argon at a total pressure of $5 \times 10^{-3}$ torr. Line 1 is the resistance values per square for the conventional process. As seen in the drawing figure the electrical resistance is too high to be practical as a low resistance bolometric material. The typical films such as described above were 1000 angstroms thick with high resistivity and thus not usable for device fabrication.

By doping these films with proper materials as described below, the resistance values can be decreased sufficiently to allow device fabrication. The present invention involves reactive co-sputtering very small amounts of tungsten with the vanadium at the same operational pressure of $5 \times 10^{-3}$ torr. Line 2 is the resistance values per square for this technique. The resulting film's resistance values were in the low kilo ohm's per square magnitude. Within the range of 1000 ohms/sq to 50,000 ohms/sq the resistance values can easily be controlled by adjusting oxygen concentration between 2.5% and 4.0% oxygen in argon.

It is understood that the technique is not limited to the particular dopant and/or film described in the preferred embodiment. Materials other than tungsten can be effectively used as a dopant to lower resistance values of vanadium films. A high-electrical conductivity value of a metal's oxide, dependent on temperature is characteristic for use as a dopant. In particular, nickel, iron, cobalt, chromium, tin, and manganese have oxides which are highly temperature dependent in their electrical conductivity. Near room temperature, small amounts of these dopant materials should be very effective in altering the resistance of parent (vanadium oxide) materials. Thin films of niobium and tantalum may also be utilized as parent materials since both are in group V-B of the periodic table along with vanadium.

While this invention has been described in terms of preferred embodiment consisting of films of vanadium/vanadium oxide with a tungsten dopant, those skilled in the art will recognize that the invention can be practiced with modification within the spirit and scope of the appended claims.

Having thus described our invention, what we claim as new and desire to secure by Letters Patent is as follows:

1. A technique for fabrication of thin-film bolometric materials for use in low-ohm multi-detector devices, comprising:

reactive co-sputtering a group V-B periodic table element or compound in an oxygen containing atmosphere with small amounts of a dopant, where the dopant has an oxide that is highly temperature dependent with an electrical resistance that varies in accordance with the oxide content of the dopant, whereby a change in electrical resistance of the resultant doped material may be achieved by adjusting the oxygen content of the atmosphere during the doping process, wherein the dopant is selected from the group consisting of nickel, iron, cobalt, chromium, tin, and manganese.

2. The technique of claim 1 wherein said Group VB element is vanadium.

3. The technique of claim 1 wherein the oxygen content is adjustable between 2.5% and 4.0%.

* * * * *